United States Patent
Freeman et al.

(10) Patent No.: US 7,170,921 B1
(45) Date of Patent: Jan. 30, 2007

(54) MAGNETO-OPTIC VARIABLE OPTICAL ATTENUATOR

(75) Inventors: William Freeman, Castro Valley, CA (US); Steve Wang, San Jose, CA (US); Frank H. Levinson, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 314 days.

(21) Appl. No.: 10/688,364

(22) Filed: Oct. 17, 2003

Related U.S. Application Data

(60) Provisional application No. 60/419,436, filed on Oct. 18, 2002.

(51) Int. Cl.
*H01S 3/08* (2006.01)
*G02F 1/09* (2006.01)

(52) U.S. Cl. .................. 372/106; 359/281; 359/324

(58) Field of Classification Search .............. 372/27, 372/37, 106; 359/280, 281, 283, 324
See application file for complete search history.

(56) References Cited

U.S. PATENT DOCUMENTS

| | | | |
|---|---|---|---|
| 3,411,840 A * | 11/1968 | Robinson | 359/282 |
| 4,178,073 A * | 12/1979 | Uchida et al. | 359/484 |
| 4,989,938 A | 2/1991 | Tamulevich | |
| 5,015,057 A | 5/1991 | Rumbaugh et al. | |
| 5,048,937 A * | 9/1991 | Takeda et al. | 359/301 |
| 5,436,921 A | 7/1995 | Corio | |
| 5,535,046 A * | 7/1996 | Shirai et al. | 359/281 |
| 5,598,293 A | 1/1997 | Green | |
| 5,812,304 A * | 9/1998 | Shirasaki et al. | 359/324 |
| 5,867,300 A * | 2/1999 | Onaka et al. | 359/283 |
| 6,205,280 B1 | 3/2001 | Wagoner et al. | |
| 6,266,474 B1 | 7/2001 | Han et al. | |
| 6,275,320 B1 | 8/2001 | Dhuler et al. | |
| 6,437,901 B1 | 8/2002 | Kobayashi et al. | |
| 6,580,546 B1 * | 6/2003 | Liu et al. | 359/280 |
| 6,792,192 B1 * | 9/2004 | Kumayasu et al. | 385/140 |

* cited by examiner

*Primary Examiner*—James Menefee
(74) *Attorney, Agent, or Firm*—Workman Nydegger

(57) ABSTRACT

A magneto-optic variable optical attenuator is provided that is used to control the intensity of a light signal. The optical attenuator includes at least one polarizing element having an optical polarization axis, wherein the polarizing element transmits a portion of an incident light signal proportional to the angular difference between an optical polarization axis of the incident light signal and that of the polarizing element. The optical attenuator also comprises a variable faraday rotator that includes a semi-transparent material, a magnetic material for applying a magnetic force to a light signal that is passed through the semi-transparent material, and a conductive wire configured to induce a magnetic field on the magnetic material. In various embodiments, the optical attenuator is employed as part of a laser package that includes a laser light source and a plurality of polarizing elements, which are in optical communication with a faraday rotator and/or a variable faraday rotator.

31 Claims, 4 Drawing Sheets

MAGNETO-OPTIC VARIABLE OPTICAL ATTENUATOR

This application claims the benefit of priority to U.S. Provisional Application No. 60/419,436, filed on Oct. 18, 2002, the disclosure of which is herein incorporated by reference.

BACKGROUND OF THE INVENTION

1. Field of the Invention

The invention relates generally to the field of optical attenuation devices for use in optical systems. In particular, the present invention relates to a variable optical attenuator that requires little space and has no moving parts.

2. Background Technology

Fiber optics are increasingly used for transmitting voice and data signals. As a transmission medium, light provides a number of advantages over traditional electrical communication techniques. For example, light signals allow for extremely high transmission rates and very high bandwidth capabilities. Also, light signals are resistant to electromagnetic interference that would otherwise interfere with electrical signals. Light also provides a more secure signal because it does not emanate the type of high frequency components often experienced with conductor-based electrical signals. Light also can be conducted over greater distances without the signal loss typically associated with electrical signals on a copper conductor.

Many conventional electrical networks are being upgraded to optical networks to take advantage of the increased speed and efficiency. Optical communication networks use lasers to create light which is then modulated to convey information. One of the many components of an optical communications network is an optical attenuator. Optical attenuators control the intensity of one or more wavelengths of light within an optical system. On occasion, it is necessary to recalibrate or replace one or more of the lasers generating light in the system. To avoid data corruption, it is necessary to completely extinguish the laser's light from the optical system before recalibration or replacement. Optical attenuators are capable of extinguishing the laser's light by blocking it from entering the remainder of the optical system.

There are numerous general methods of attenuating or completely extinguishing light including polarization, reflection, diffusion, etc. In addition, it is often necessary to control the intensity of a particular wavelength or channel of light entering a fiber. Although it is possible to simply adjust the electrical current feeding a laser to adjust the output intensity, this is not desirable because this method of attenuation will affect the bandwidth capabilities of the laser. Therefore, it is necessary to use a variable optical attenuator to attenuate or adjust the output intensity of a particular laser.

Polarization is often used in optical attenuators to attenuate light signals within an optical system. One type of optical attenuator that utilizes polarization is a mechanical attenuator that contains two or more polarizing elements to attenuate the light signal. When the polarizing elements are rotated with respect to one another the output light is attenuated as a function of the angle between the polarization axis of the polarizing elements. For two polarizing elements, this phenomena follows Malus' law and is stated mathematically: $I_{out} = I_{in} \cos^2 \theta$, where $\theta$ is the angular difference between the polarization axis of the two polarizing elements. Attenuators of this type typically include some form of rotation mechanism to rotate one of the polarizing elements with respect to the other one. It is necessary for the optical attenuator to be variable such that a user can adjust the amount of attenuation for a particular situation. A polarizing element may be a standard polarizer or a crystal containing polarization properties. These crystals include quartz, BBO, YVO4, and the like. Although these types of attenuators are effective at attenuating the light signal, it is undesirable to include moving parts in an optical attenuator. Mechanical devices typically wear out over time and often introduce drift characteristics. Mechanical devices also take up relatively large amounts of precious space and are therefore not suitable for many optical applications.

Therefore, there is a need in the industry for a variable optical attenuator that has no moving parts and takes up very little space. In addition, the optical attenuator should be capable of being incorporated into an optical transceiver package.

SUMMARY OF THE INVENTION

The present invention is directed to a magneto-optic variable optical attenuator (VOA) that is used to control the intensity of a light signal. The magneto-optic VOA is capable of precisely adjusting the intensity of a light beam from 0 to 100% in response to an electrical voltage.

In general, the optical attenuator includes at least one polarizing element having an optical polarization axis, wherein the polarizing element transmits a portion of an incident light signal proportional to the angular difference between an optical polarization axis of the incident light signal and that of the polarizing element. The optical attenuator also comprises a variable faraday rotator that includes a semi-transparent material, a magnetic material capable of applying a magnetic force to a light signal that is passed through the semi-transparent material, and a conductive wire configured to induce a magnetic field on the magnetic material when a current is passed through the conductive wire.

In various embodiments of the invention, the optical attenuator is employed as part of a laser package that includes a laser light source and a plurality of polarizing elements, which are in optical communication with a faraday rotator and/or a variable faraday rotator. The optical attenuator in the laser packages can also be employed as part of an optical transceiver package.

In a method of attenuating a light signal according to the invention, a light signal is directed from a laser light source to a first polarizing element having an optical polarization axis. At least a portion of the light signal is transmitted through the first polarizing element to a variable faraday rotator, with the transmitted light signal being proportional to the angular difference between an optical polarization axis of the light signal and that of the first polarizing element. The light signal is then directed from the variable faraday rotator to a second polarization element.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

In general, the present invention is directed to a magneto-optic variable optical attenuator (VOA) that is used to control the intensity of a light signal. As will be described in further detail below, the magneto-optic VOA is capable of precisely adjusting the intensity of a light beam from 0 to 100% in response to an electrical voltage. The variable optical attenuator of the invention has the benefit of no moving parts and takes up very little space.

While embodiments of the present invention are described in the context of optical networking, it will be appreciated that the teachings of the present invention are applicable to other applications as well.

Reference will now be made to the drawings to describe various embodiments of the invention. It is to be understood that the drawings are diagrammatic and schematic representations of the embodiments, and are not limiting of the present invention, nor are they necessarily drawn to scale.

Figure 1:
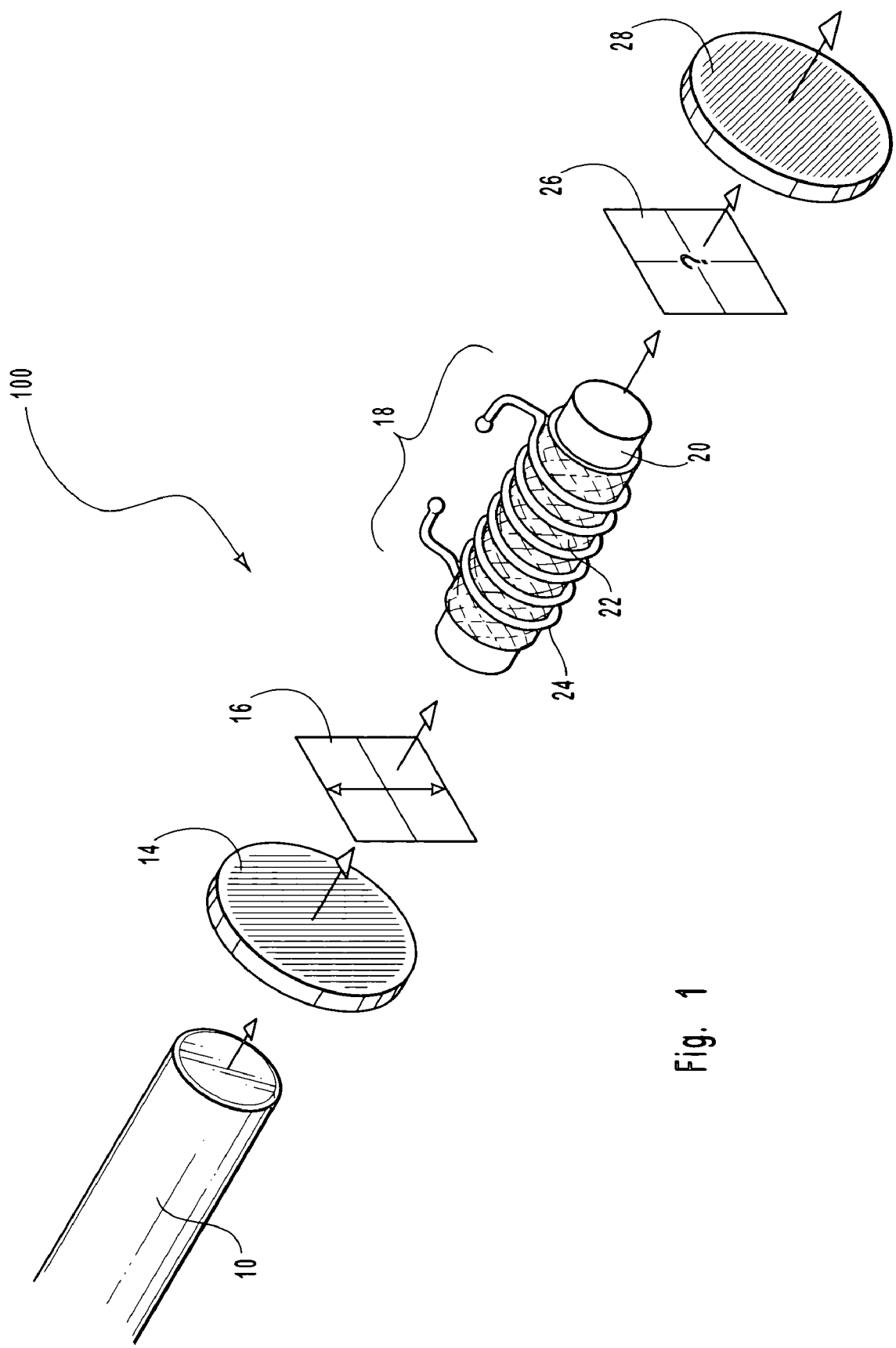
FIG. 1 illustrates a perspective view of one embodiment of a laser package including a magneto-optic variable optical attenuator.

Referring first to FIG. 1, one embodiment of a laser package including a magneto-optic variable optical attenuator is designated generally at 100. The laser package 100 is designed for use in an optical communications system. A laser 10 generates a light signal of a particular wavelength. Although illustrated in a cylindrical manner, the laser 10 could be a semiconductor laser, a gas laser or any other type of laser depending on the application parameters. In this embodiment, the laser 10 is a distributed feedback laser which emits a light signal that is essentially one wavelength. The light signal generated by the laser 10 is transmitted into a first polarizing element 14. A polarizing element is defined as any element with a linear optical polarity such as a polarizer or certain types of crystals. Light that passes through a polarizing element is diminished unless the axis of polarization of the polarizing element is the same as the incident light. For example, if horizontally polarized light is transmitted into a vertical polarizing element, the polarizing element will block essentially all light from passing through the polarizing element. Lasers generally create polarized light and it is therefore important to properly orient the laser with the first polarizing element 14 to create the highest initial intensity. The polarity status of the light signal exiting the first polarizing element 14 is vertically oriented as indicated by a first chart 16.

With continued reference to FIG. 1, the light signal is transmitted into a variable faraday rotator 18. The variable faraday rotator 18 is capable of rotating the polarity of the light signal in response to an electrical current. The variable faraday rotator comprises a semi-transparent material such as a garnet 20, a magnetic material 22, and a conductive wire 24. The variable faraday rotator 18 utilizes the Faraday effect, in which a magnetic field has the capability of affecting the polarization of light. The garnet 20 is enclosed in the magnetic material 22 and wrapped with a conductive wire 24 for the purpose of inducing a magnetic field upon light transmitting through the garnet. The magnetic material 22 in this embodiment is composed of a hard ferromagnetic material. Ferromagnetic materials are easily magnetized and are capable of producing large forces. A hard ferromagnetic material has a wide hysteresis curve (B v H or Magnetic curve) and therefore has the ability to generate remnant magnetization even after an external magnetic field is turned off.

The conductive wire 24 is wrapped around the garnet 20 and the magnetic material 22 to induce an external magnetic field. The conductive wire 24 is electrically connected to outside circuitry (not shown) for the purpose of applying a current through the conductive wire 24 at a particular time and of a particular magnitude. By applying a current through a coiled wire, a magnetic field is created. The magnitude of the magnetic field is proportional to the amount of rotation induced upon the polarity of the light signal transmitted through the garnet. Because of the inclusion of the hard ferromagnetic material between the garnet 20 and the conductive wire 24, the current only needs to be pulsed in order to create a magnetic field upon the garnet. Likewise, the remnant magnetization of the hard ferromagnetic material can be turned off by inducing an external magnetic field with the conductive wire of the same magnitude and an opposite polarity. The polarization of the light signal exiting the variable faraday rotator is variable depending on the amount of rotation induced on the light signal by the variable faraday rotator 18, as indicated by the uncertain status of a second chart 26.

With continued reference to FIG. 1, the light signal is then transmitted through a second polarizing element 28. The intensity of the light exiting the second polarizing element 28 depends on the angular difference between the polarization state of the light signal entering the second polarizing element 28 and the orientation of the second polarizing element 28. This relationship is stated mathematically: $I_{out} = I_{in} \cos^2 \theta$, where $\theta$ is the angular difference between the polarization of the incoming light signal and the second polarizing element 28. Therefore, the intensity of the light signal exiting the second polarizing element 28 is attenuated. In addition to attenuating the light signal, the laser package 100 also acts as an isolator by transmitting the light signal through the polarizing elements 14, 28 and the variable faraday rotator 18. Optical isolators are commonly used in laser packages to reduce aberrations and reflections from a light signal. Isolation of the light signal is important to remove undesired reflections and aberrations from the light signal.

Figure 2:
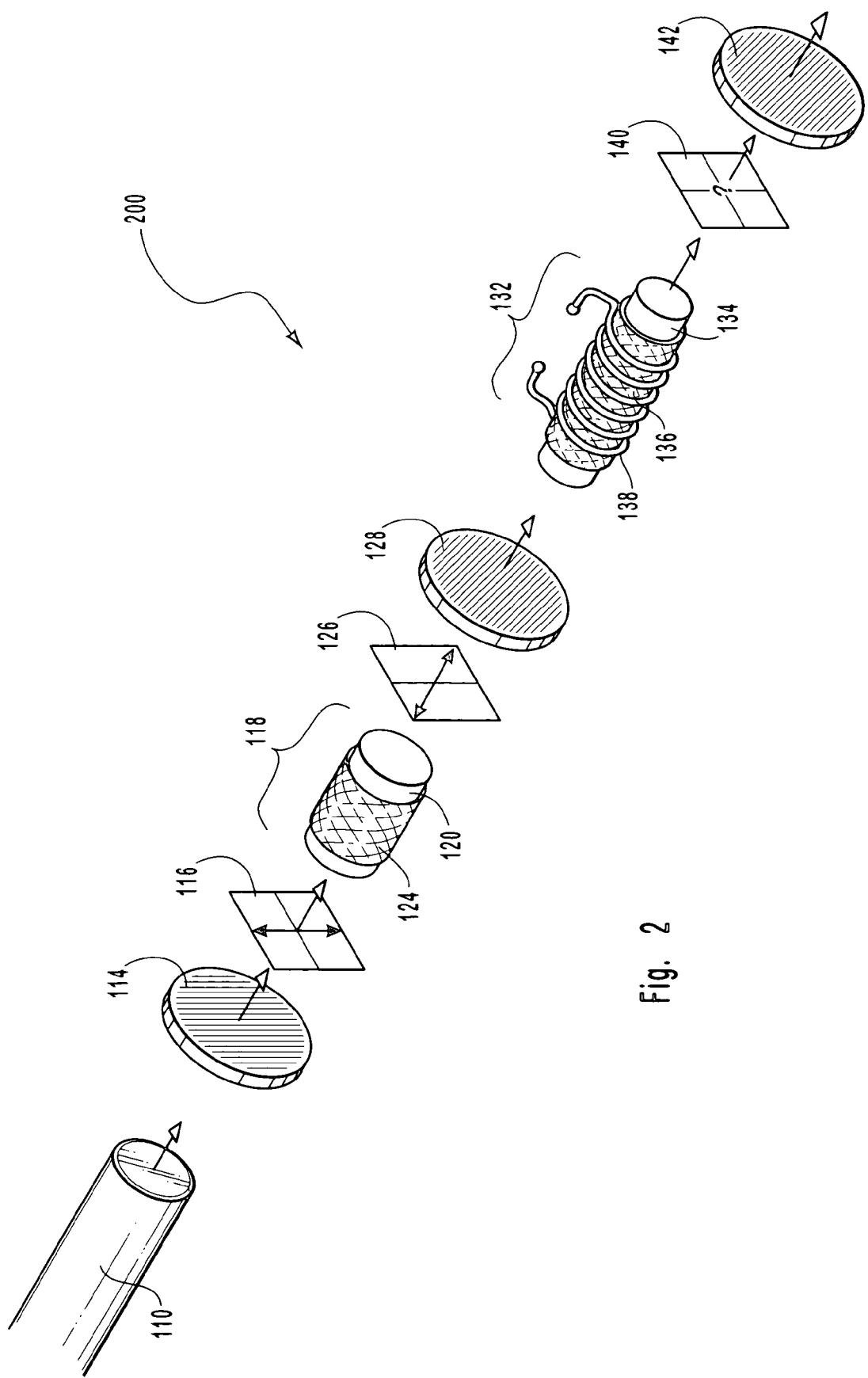
FIG. 2 illustrates a perspective view of one alternative embodiment of a laser package including an isolator and a magneto-optic variable optical attenuator.

Reference is next made to FIG. 2, which illustrates a perspective view of one alternative embodiment of a laser package including an isolator and a magneto-optic variable optical attenuator, designated generally at 200. In this embodiment, the light signal is transmitted from the laser 110 into a first polarizing element 114, wherein the resulting light signal polarity is vertically aligned as shown in a first chart 116. The light signal then enters a faraday rotator 118. The faraday rotator 118 includes a garnet 120 and a magnetic material 124. The magnetic material 124 is a permanent magnet or a premagnetized hard ferromagnetic material that exhibits remnant magnetization. The garnet 120 and the magnetic material 124 induce a magnetic field across the light signal transmitting through the faraday rotator 118. As discussed above with reference to FIG. 1, this magnetic field has the affect of rotating the plane of polarization. But unlike the variable faraday rotator discussed with reference to FIG. 1, the faraday rotator 118 rotates the plane of polarization by a fixed amount. In this embodiment, the faraday rotator rotates the plane of polarization by 45 degrees in the clockwise direction, as illustrated in a second chart 126. The light signal then passes through a second polarizing element 128 which is oriented in a direction to allow the desired portion of the light signal to pass. The first polarizing element 114, faraday rotator 118 and the second polarizing element 128 effectively isolate a portion of the incident light signal from the laser 110. This isolation is important for avoiding interference and distortion of the light signal during use in an optical communications system.

With continued reference to FIG. 2, the light signal then transmits into a variable faraday rotator 132. The variable faraday rotator 132 further includes a garnet 134, a magnetic material 136, and a conductive wire 138. The variable faraday rotator 132 is discussed in more detail with reference to FIG. 1. When an electrical voltage is applied to the conductive wire 138, the variable faraday rotator 132 rotates the plane of polarization of the light signal transmitting therethrough by a predetermined amount proportional to the electrical voltage. The light signal exiting the variable faraday rotator 132 has an unknown polarization state as indicated by a third chart 140. The light signal then passes through a third polarizing element 142. As discussed above with reference to FIG. 1, the light signal exiting the third polarizing element 142 will be attenuated by an amount proportional to the angular difference between the polarization state of the light signal itself and that of the third polarizing element 142.

Figure 3:
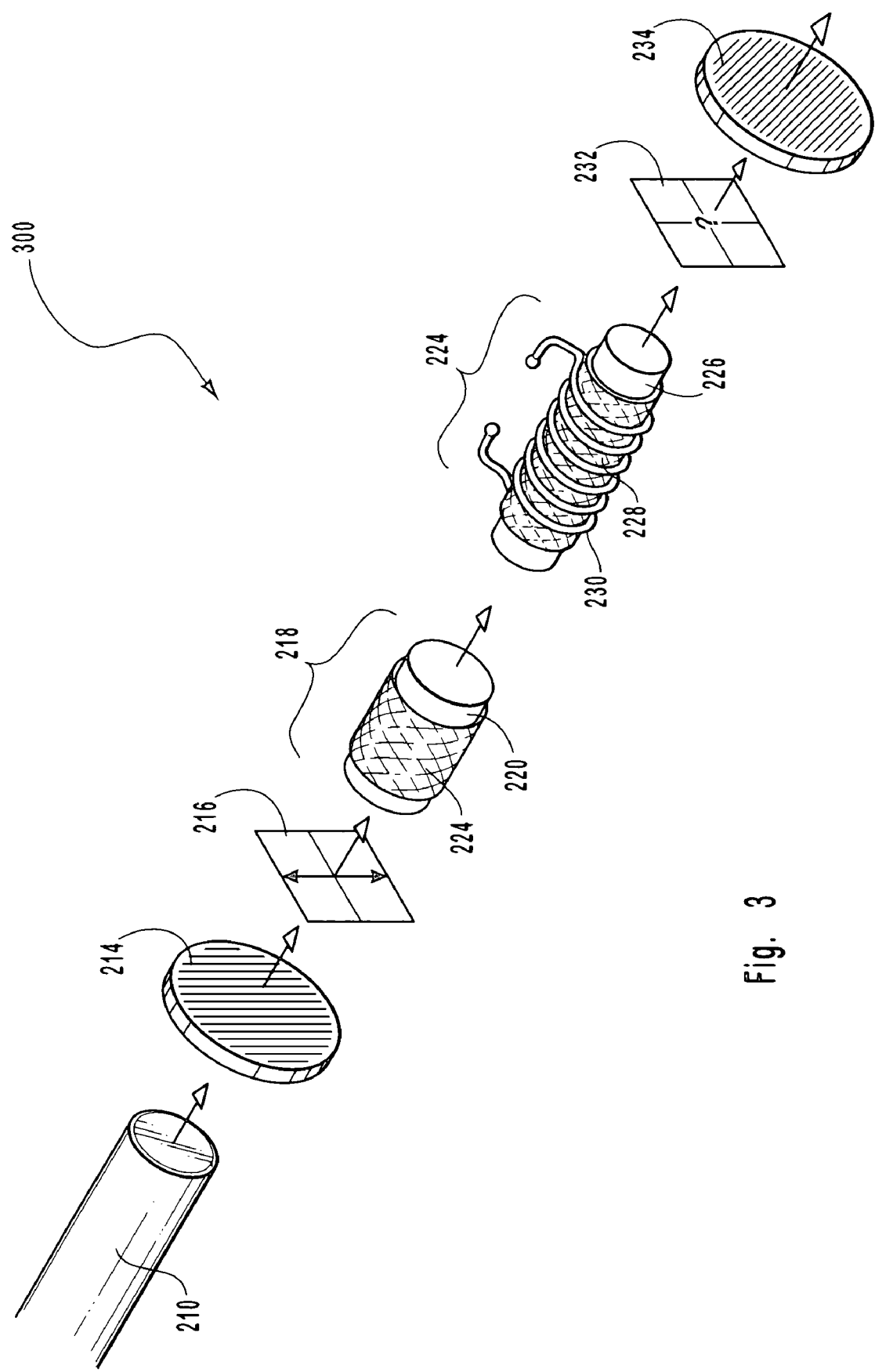
FIG. 3 illustrates a perspective view of another alternative embodiment of a laser package including a magneto-optic variable optical attenuator.

Reference is next made to FIG. 3, which illustrates a perspective view of another alternative embodiment of a laser package including a magneto-optic variable optical attenuator, designated generally at 300. This embodiment takes the light signal from a laser 210 into a first polarizing element 214, wherein the resulting light signal polarity is vertically aligned as shown in a first chart 216. The light signal then enters a faraday rotator 218. The faraday rotator 218 includes a garnet 220 and a magnetic material 224. The magnetic material 224 is a permanent magnet or a premagnetized hard ferromagnetic material that exhibits remnant magnetization. The garnet 220 and the magnetic material 224 induce a magnetic field across the light signal transmitting through the faraday rotator 218. As discussed above with reference to FIG. 1, this magnetic field has the effect of rotating the plane of polarization. But unlike the variable faraday rotator discussed with reference to FIG. 1, the faraday rotator 218 rotates the plane of polarization by a fixed amount.

With continued reference to FIG. 3, the light signal then transmits into a variable faraday rotator 224. The variable faraday rotator 224 further includes a garnet 226, a magnetic material 228, and a conductive wire 230. The variable faraday rotator is discussed in more detail with reference to FIG. 1. When an electrical voltage is applied to the conductive wire 230, the variable faraday rotator 224 rotates the plane of polarization of the light signal transmitting therethrough by a predetermined amount proportional to the electrical voltage. The light signal exiting the variable faraday rotator 224 has an unknown polarization state as indicated by a third chart 232. The light signal then passes through a second polarizing element 234. As discussed above with reference to FIG. 1, the light signal exiting the second polarizing element 234 will be attenuated by an amount proportional to the angular difference between the polarization state of the light signal itself and that of the second polarizing element 234. The laser package 300 combines the isolation optics and the attenuation optics such that the light signal is isolated and attenuated at the same time similar to the laser package described with reference to FIG. 1.

Figure 4:
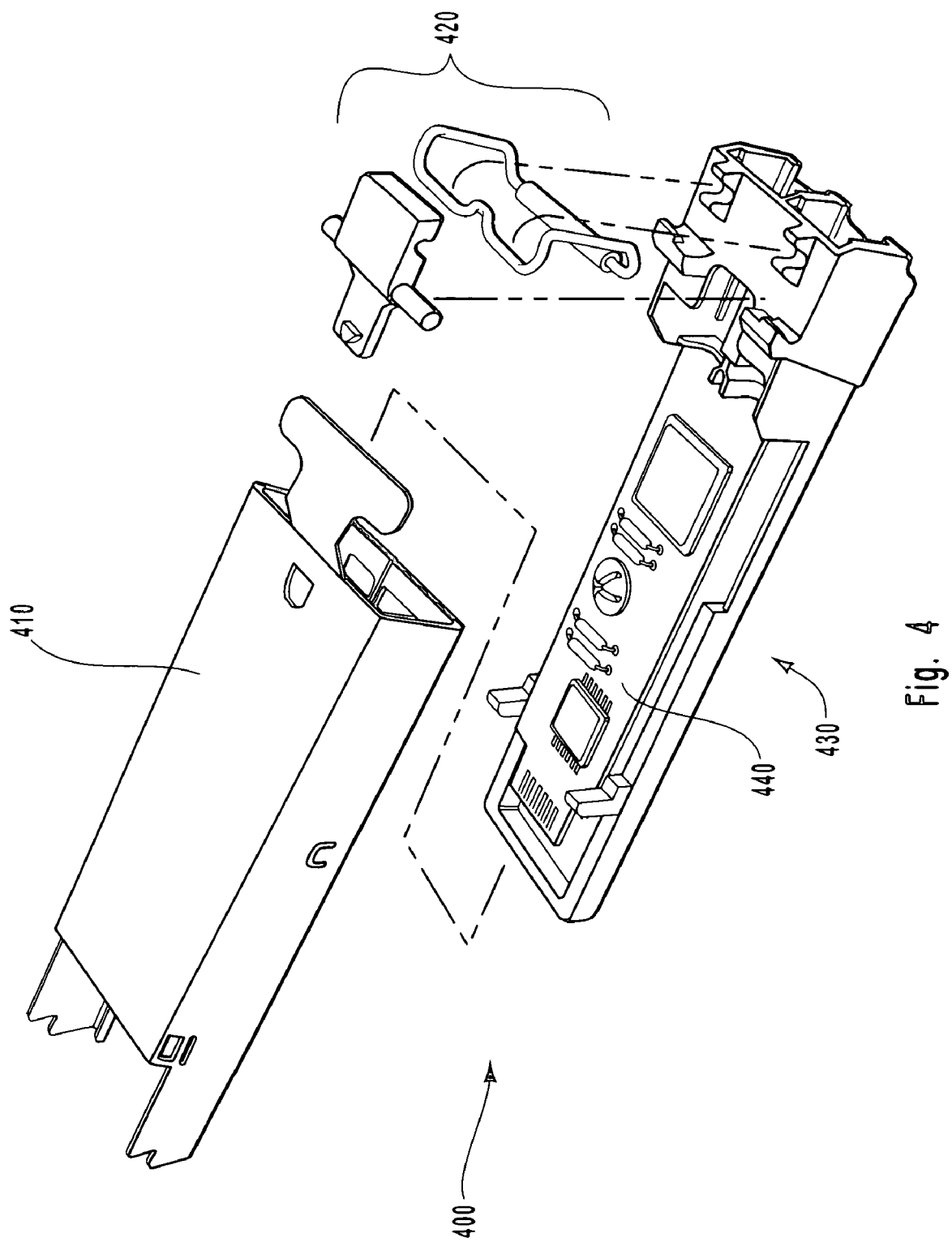
FIG. 4 illustrates an exploded view of an optical transceiver package environment for a variable optical attenuator.

Reference is next made to FIG. 4, which illustrates an exploded view of an optical transceiver package environment for a variable optical attenuator, designated generally at 400. The optical transceiver package 400 includes a housing 410, a latch system 420, and a module 430. The module 430 further includes a printed circuit board 440 containing the optical and electrical elements for an optical transmitter or laser package and an optical receiver. The laser packages shown in FIGS. 1–3 can be incorporated as the transmitter in the illustrated transceiver package 400.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical attenuator comprising:
   at least one polarizing element having an optical polarization axis, wherein the polarizing element transmits a portion of an incident light signal proportional to the angular difference between an optical polarization axis of the incident light signal and that of the polarizing element; and
   a variable faraday rotator including:
      a semi-transparent material, wherein the semi-transparent material has a substantially cylindrical shape having a central axis;
      a magnetic material for applying a magnetic force to a light signal that is passed through the semi-transparent material, wherein the magnetic material is wrapped around an outer perimeter of the semi-transparent material; and
      a conductive wire disposed around at least a portion of the semi-transparent material and configured to induce a magnetic field on the magnetic material when a current is passed through the conductive wire, wherein the conductive wire is wrapped around an outer perimeter of the magnetic material.

2. The optical attenuator of claim 1, wherein the polarizing element comprises a polarizer having a linear optical polarity.

3. The optical attenuator of claim 1, wherein the semi-transparent material comprises a garnet.

4. The optical attenuator of claim 1, wherein the magnetic material comprises a hard ferromagnetic material.

5. The optical attenuator of claim 1, wherein the semi-transparent material is at least partially enclosed in the magnetic material.

6. The optical attenuator of claim 1, wherein the conductive wire is wrapped around the magnetic material.

7. A laser package comprising:
   a laser light source;
   a first polarizing element having an optical polarization axis and in optical communication with the laser light source, wherein the first polarizing element transmits a portion of an incident light signal proportional to the angular difference between an optical polarization axis of the incident light signal and that of the first polarizing element;

a variable faraday rotator in optical communication with the first polarizing element and including:
  a semi-transparent material, wherein the semi-transparent material has a substantially cylindrical shape having a central axis;
  a magnetic material configured to apply a magnetic force to a light signal that is passed through the semi-transparent material, wherein the magnetic material is wrapped around an outer perimeter of the semi-transparent material; and
  a conductive wire disposed around at least a portion of the semi-transparent material and configured to induce a magnetic field on the magnetic material when a current is passed through the conductive wire, wherein the conductive wire is wrapped around an outer perimeter of the magnetic material; and a second polarizing element having an optical polarization axis and in optical communication with the variable faraday rotator, wherein the second polarizing element transmits a portion of an incident light signal proportional to the angular difference between an optical polarization axis of the incident light signal and that of the second polarizing element.

8. The laser package of claim 7, wherein the laser light source comprises a semiconductor laser or a gas laser.

9. The laser package of claim 7, wherein the laser light source comprises a distributed feedback laser.

10. The laser package of claim 7, wherein the polarizing elements each comprise a polarizer having a linear optical polarity.

11. The laser package of claim 7, wherein the semi-transparent material comprises a garnet.

12. The laser package of claim 7, wherein the magnetic material comprises a hard ferromagnetic material.

13. The laser package of claim 7, wherein the semi-transparent material is at least partially enclosed in the magnetic material.

14. The laser package of claim 7, wherein the conductive wire is wrapped around the magnetic material.

15. An optical transceiver package comprising the laser package of claim 7.

16. A laser package comprising:
  a laser light source;
  a first polarizing element having an optical polarization axis and in optical communication with the laser light source, wherein the first polarizing element transmits a portion of an incident light signal proportional to the angular difference between an optical polarization axis of the incident light signal and that of the first polarizing element;
  a faraday rotator in optical communication with the first polarizing element and including:
    a semi-transparent material; and
    a magnetic material at least partially surrounding the semi-transparent material and configured to apply a magnetic force to a light signal that is passed through the semi-transparent material;
  a second polarizing element having an optical polarization axis and in optical communication with the faraday rotator, wherein the second polarizing element transmits a portion of an incident light signal proportional to the angular difference between an optical polarization axis of the incident light signal and that of the second polarizing element;
  a variable faraday rotator in optical communication with the second polarizing element and including:
    a semi-transparent material, wherein the semi-transparent material has a substantially cylindrical shape having a central axis;
    a magnetic material configured to apply a magnetic force to a light signal that is passed through the semi-transparent material, wherein the magnetic material is wrapped around an outer perimeter of the semi-transparent material; and
    a conductive wire disposed around at least a portion of the semi-transparent material and configured to induce a magnetic field on the magnetic material when a current is passed through the conductive wire, wherein the conductive wire is wrapped around an outer perimeter of the magnetic material; and
  a third polarizing element having an optical polarization axis and in optical communication with the variable faraday rotator, wherein the third polarizing element transmits a portion of an incident light signal proportional to the angular difference between an optical polarization axis of the incident light signal and that of the third polarizing element.

17. The laser package of claim 16, wherein the laser light source comprises a semiconductor laser or a gas laser.

18. The laser package of claim 16, wherein the laser light source comprises a distributed feedback laser.

19. The laser package of claim 16, wherein the polarizing elements each comprise a polarizer having a linear optical polarity.

20. The laser package of claim 16, wherein the semi-transparent materials comprise garnet.

21. The laser package of claim 16, wherein the magnetic material of the faraday rotator comprises a permanent magnet or a premagnetized hard ferromagnetic material.

22. The laser package of claim 16, wherein the magnetic material of the variable faraday rotator comprises a hard ferromagnetic material.

23. An optical transceiver package comprising the laser package of claim 16.

24. A laser package comprising:
  a laser light source;
  a first polarizing element having an optical polarization axis and in optical communication with the laser light source, wherein the first polarizing element transmits a portion of an incident light signal proportional to the angular difference between an optical polarization axis of the incident light signal and that of the first polarizing element;
  a faraday rotator in optical communication with the first polarizing element and including:
    a semi-transparent material; and
    a magnetic material at least partially surrounding the semi-transparent material and configured to apply a magnetic force to a light signal that is passed through the semi-transparent material;
  a variable faraday rotator in optical communication with the faraday rotator and including:
    a semi-transparent material, wherein the semi-transparent material has a substantially cylindrical shape having a central axis;
    a magnetic material configured to apply a magnetic force to a light signal that is passed through the semi-transparent material, wherein the magnetic material is wrapped around an outer perimeter of the semi-transparent material; and a conductive wire disposed around at least a portion of the semi-transparent material and configured to induce a magnetic field on the magnetic material when a current is passed through the conductive wire, wherein the conductive wire is wrapped around an outer perimeter of the magnetic material; and a second polarizing element having an optical polarization axis and in optical communication with the variable faraday rotator, wherein the second polarizing element transmits a portion of an incident light signal proportional to the angular difference between an optical polarization axis of the incident light signal and that of the second polarizing element.

25. The laser package of claim 24, wherein the laser light source comprises a semiconductor laser or a gas laser.

26. The laser package of claim 24, wherein the laser light source comprises a distributed feedback laser.

27. The laser package of claim 24, wherein the polarizing elements each comprise a polarizer having a linear optical polarity.

28. The laser package of claim 24, wherein the semi-transparent materials comprise garnet.

29. The laser package of claim 24, wherein the magnetic material of the faraday rotator comprises a permanent magnet or a premagnetized hard ferromagnetic material.

30. The laser package of claim 24, wherein the magnetic material of the variable faraday rotator comprises a hard ferromagnetic material.

31. An optical transceiver package comprising the laser package of claim 24.

* * * * *